United States Patent
Schepers et al.

(10) Patent No.: US 8,680,493 B2
(45) Date of Patent: Mar. 25, 2014

(54) RADIATION CONDUIT FOR RADIATION SOURCE

(75) Inventors: Maikel Adrianus Cornelis Schepers, Nuenen (NL); Markus Franciscus Antonius Eurlings, Tilburg (NL); Franciscus Johannes Joseph Janssen, Geldrop (NL); Bernard Jacob Andries Stommen, Geldrop (NL); Hrishikesh Patel, Eindoven (NL); Hermanus Johannes Maria Kreuwel, Schijndel (NL); Jacob Cohen, Eindhoven (NL); Pepijn Wijnand Jozef Janssen, Eindhoven (NL); Maarten Kees Jan Boon, Moergestel (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 13/489,096

(22) Filed: Jun. 5, 2012

(65) Prior Publication Data

US 2013/0001442 A1    Jan. 3, 2013

Related U.S. Application Data

(60) Provisional application No. 61/495,200, filed on Jun. 9, 2011.

(51) Int. Cl.
*G01J 3/10* (2006.01)
(52) U.S. Cl.
USPC .................................................. 250/504 R
(58) Field of Classification Search
USPC .............. 250/504 R, 492.1, 492.2, 493.1
See application file for complete search history.

(56) References Cited

U.S. PATENT DOCUMENTS

| | | | |
|---|---|---|---|
| 6,919,573 B2 | 7/2005 | Roux | |
| 6,987,275 B2 | 1/2006 | Bakker et al. | |
| 7,812,329 B2 * | 10/2010 | Bykanov et al. | 250/504 R |
| 8,120,752 B2 | 2/2012 | Soer et al. | |
| 8,345,223 B2 | 1/2013 | Soer et al. | |
| 2004/0013226 A1 | 1/2004 | Bakker et al. | |
| 2004/0183030 A1 | 9/2004 | Roux | |
| 2004/0256575 A1 * | 12/2004 | Singer et al. | 250/492.2 |
| 2007/0102653 A1 * | 5/2007 | Bowering et al. | 250/504 R |

(Continued)

OTHER PUBLICATIONS

U.S. Appl. No. 61/435,846, filed Jan. 25, 2011, Naghmeh Hajhosseini et al.

(Continued)

*Primary Examiner* — Robert Kim
*Assistant Examiner* — Jason McCormack
(74) *Attorney, Agent, or Firm* — Pillsbury Winthrop Shaw Pittman LLP

(57) ABSTRACT

A radiation source includes a fuel supply configured to deliver fuel to a plasma emission location for vaporization by a laser beam to form a plasma, and a collector configured to collect EUV radiation emitted by the plasma and direct the EUV radiation towards an intermediate focus. The collector includes a diffraction grating configured to diffract infrared radiation emitted by the plasma. The radiation source includes a radiation conduit located in between the collector and the intermediate focus. The radiation conduit includes an entrance aperture connected by an inwardly tapering body to an exit aperture. The radiation conduit includes an inner portion and an outer portion, the inner portion being closer to the intermediate focus than the outer portion. The inner portion is configured to reflect incident diffracted infrared radiation towards the outer portion.

13 Claims, 5 Drawing Sheets

(56) References Cited

U.S. PATENT DOCUMENTS

| | | |
|---|---|---|
| 2009/0284725 A1 | 11/2009 | Soer et al. |
| 2009/0289205 A1* | 11/2009 | Moriya et al. ............ 250/504 R |
| 2010/0020304 A1 | 1/2010 | Soer et al. |
| 2010/0141909 A1* | 6/2010 | Wassink et al. ................. 355/30 |
| 2011/0019174 A1 | 1/2011 | Soer et al. |
| 2011/0026002 A1* | 2/2011 | Loopstra et al. ................ 355/71 |
| 2011/0164236 A1* | 7/2011 | Yakunin et al. ................. 355/67 |
| 2011/0222040 A1* | 9/2011 | Steinhoff et al. ............... 355/67 |
| 2011/0240890 A1* | 10/2011 | Govindaraju et al. .... 250/504 R |
| 2011/0253913 A1* | 10/2011 | Nagai et al. ............... 250/504 R |
| 2011/0261329 A1* | 10/2011 | Schimmel et al. .............. 355/30 |

OTHER PUBLICATIONS

European Search Report dated Oct. 30, 2012 in corresponding European Patent Application No. 12158338.9.

\* cited by examiner

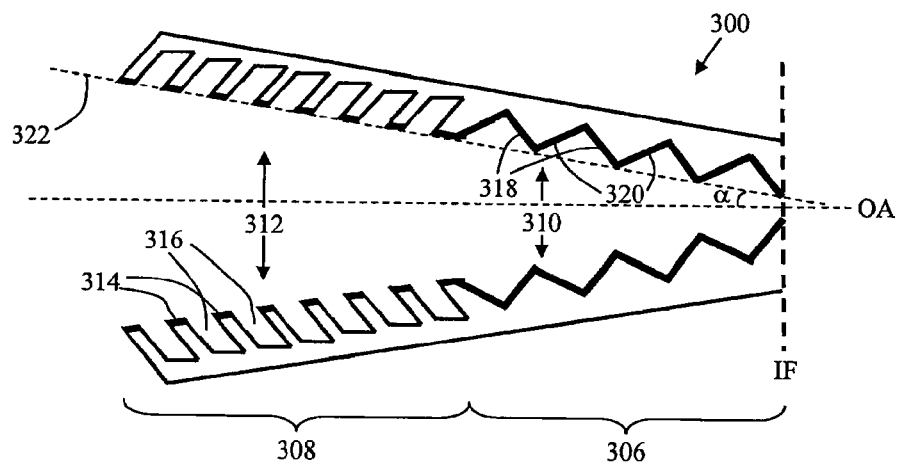
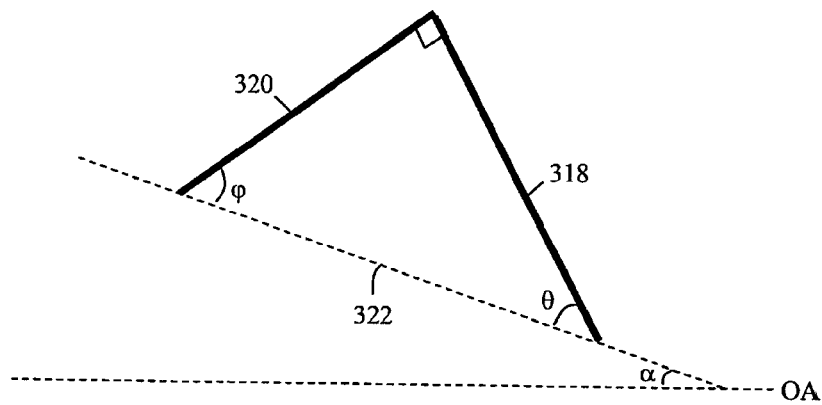
Figure 5
Figure 6

RADIATION CONDUIT FOR RADIATION SOURCE

CROSS-REFERENCE TO RELATED APPLICATIONS

This application claims the benefit of priority from U.S. Provisional Patent Application Ser. No. 61/495,200, filed on Jun. 9, 2011, which is incorporated herein by reference in its entirety.

FIELD

The present invention relates to a radiation source and to a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm, for example within the range of 5-10 nm such as 6.7 nm or 6.8 nm. Possible sources include, for example, laser-produced plasma sources, discharge plasma sources, or sources based on synchrotron radiation provided by an electron storage ring.

EUV radiation may be produced using a plasma. A radiation source for producing EUV radiation may receive a laser beam which excites a fuel to provide the plasma. The plasma may be created, for example, by directing the laser beam at fuel such as particles of a suitable material (e.g. tin), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The radiation source may include an enclosing structure or chamber arranged to provide a vacuum environment to support the plasma. Such a radiation system is typically termed a laser produced plasma (LPP) source.

In addition to emitting EUV radiation, the plasma may also emit infrared radiation. This infrared radiation may cause heating of components of the lithographic apparatus which may cause those components to fail.

SUMMARY

It is desirable to provide a radiation source in which infrared radiation is dealt with in a manner which is not disclosed by the prior art.

According to an aspect of the invention, there is provided a radiation source comprising a fuel supply configured to deliver fuel to a plasma emission location for vaporization by a laser beam to form a plasma, and a collector configured to collect EUV radiation emitted by the plasma and direct the EUV radiation towards an intermediate focus. The collector comprises a diffraction grating configured to diffract infrared radiation emitted by the plasma. The radiation source comprises a radiation conduit located in between the collector and the intermediate focus. The radiation conduit comprises an entrance aperture connected by an inwardly tapering body to an exit aperture. The radiation conduit comprises an inner portion and an outer portion, the inner portion being closer to the intermediate focus than the outer portion, wherein the inner portion is configured to reflect incident diffracted infrared radiation towards the outer portion.

The inner portion may comprise a reflective structure and the outer portion may comprise an absorptive structure.

The inner portion may comprise a plurality of faces that are oriented such that they reflect incident diffracted infrared radiation towards the outer portion.

The plurality of faces may be oriented such that they reflect first order incident diffracted infrared radiation towards the outer portion.

At least some of the plurality of faces may subtend an angle of less than 70° relative to an angle of taper of the radiation conduit.

At least some of the plurality of faces may subtend an angle of 61° or less relative to an angle of taper of the radiation conduit.

The plurality of faces may extend around the interior of the radiation conduit in a direction that is substantially transverse to an optical axis of the radiation source.

The plurality of faces may have generally annular shapes.

The outer portion may comprise a plurality of ridges which are angled away from the intermediate focus.

The outer portion may comprise a first absorptive structure and a second absorptive structure.

The second absorptive structure may comprise a plurality of faces that are configured to receive infrared radiation reflected from the inner portion of the radiation conduit, and to reflect that infrared radiation across the radiation conduit.

The outer portion may comprise a plurality of faces that are configured to receive infrared radiation reflected from the inner portion of the radiation conduit, and to reflect that infrared radiation across the radiation conduit.

The second absorptive structure may have a saw-tooth form.

The first absorptive structure may comprise a plurality of ridges that are angled away from the intermediate focus.

The second absorptive structure may include faces that are substantially perpendicular to one another and that are oriented such that they retro-reflect infrared radiation that has traveled across the radiation conduit. The faces may be oriented such that they retro-reflect infrared radiation that is substantially perpendicular to the optical axis of the radiation conduit.

The infrared radiation may have a wavelength of around 10.6 μm.

According to an aspect of the invention, there is provided a radiation source comprising a fuel supply configured to deliver fuel to a plasma emission location for vaporization by a laser beam to form a plasma, and a collector configured to collect EUV radiation emitted by the plasma and direct the EUV radiation towards an intermediate focus. The collector comprises a diffraction grating configured to diffract infrared radiation emitted by the plasma. The radiation source comprises a radiation conduit located before the intermediate focus. The radiation conduit comprises an entrance aperture connected by an inwardly tapering body to an exit aperture. The radiation conduit comprises an inner portion and an outer portion, the inner portion being closer to the intermediate focus than the outer portion, wherein the inner portion comprises a reflective structure and the outer portion comprises an absorptive structure.

According to an aspect of the invention there is provided a lithographic apparatus that comprises a radiation source according to aspects of the invention, and further comprises an illumination system configured to condition a radiation beam, a support constructed to support a patterning device, the patterning device being capable of imparting the radiation beam with a pattern in its cross-section to form a patterned radiation beam, a substrate table constructed to hold a substrate, and a projection system configured to project the patterned radiation beam onto a target portion of the substrate.

The lithographic apparatus may further comprise a laser configured to generate the laser beam which vaporizes the fuel droplet to form the plasma.

Features of the different aspects of the invention may be combined with one another.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 5 schematically depicts a radiation conduit of the radiation source according to an embodiment of the invention;

FIG. 6 schematically depicts part of the radiation conduit of FIG. 5;

DETAILED DESCRIPTION

Figure 1:
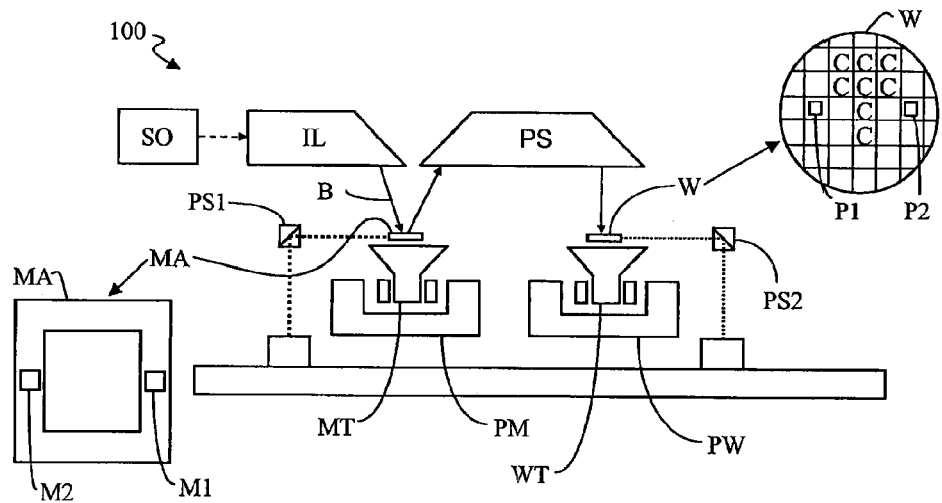
FIG. 1 schematically depicts a lithographic apparatus according to an embodiment of the invention.

FIG. 1 schematically depicts a lithographic apparatus 100 including a radiation source SO according to one embodiment of the invention. The apparatus comprises: an illumination system (illuminator) IL configured to condition a radiation beam B (e.g. EUV radiation); a support structure (e.g. a mask table) MT constructed to support a patterning device (e.g. a mask or a reticle) MA and connected to a first positioner PM configured to accurately position the patterning device; a substrate table (e.g. a wafer table) WT constructed to hold a substrate (e.g. a resist-coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since gases may absorb too much radiation. A vacuum environment may therefore be provided to the whole beam path with the aid of a vacuum wall and vacuum pumps.

As here depicted, the apparatus is of a reflective type (e.g. employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultraviolet (EUV) radiation beam from the source SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel with a laser beam. Fuel may for example be a droplet, stream or cluster of material having the required line-emitting element. The source SO may be part of an EUV radiation system including a laser, not shown in FIG. 1, for providing the laser beam which excites the fuel. The resulting plasma emits output radiation, e.g. EUV radiation, which is collected using a radiation collector located in the source. The laser and the source may be separate entities, for example when a $CO_2$ laser is used to provide the laser beam for fuel excitation. In such cases, the laser may be considered not to form part of the lithographic apparatus, and the radiation beam is passed from the laser to the source with the aid of a beam delivery system comprising, for example, suitable directing mirrors and/or a beam expander. In other cases the source may be an integral part of the source, for example when the source is a discharge produced plasma EUV generator, often termed as a DPP source.

The illuminator IL may comprise an adjuster configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g. mask) MA, which is held on the support structure (e.g. mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
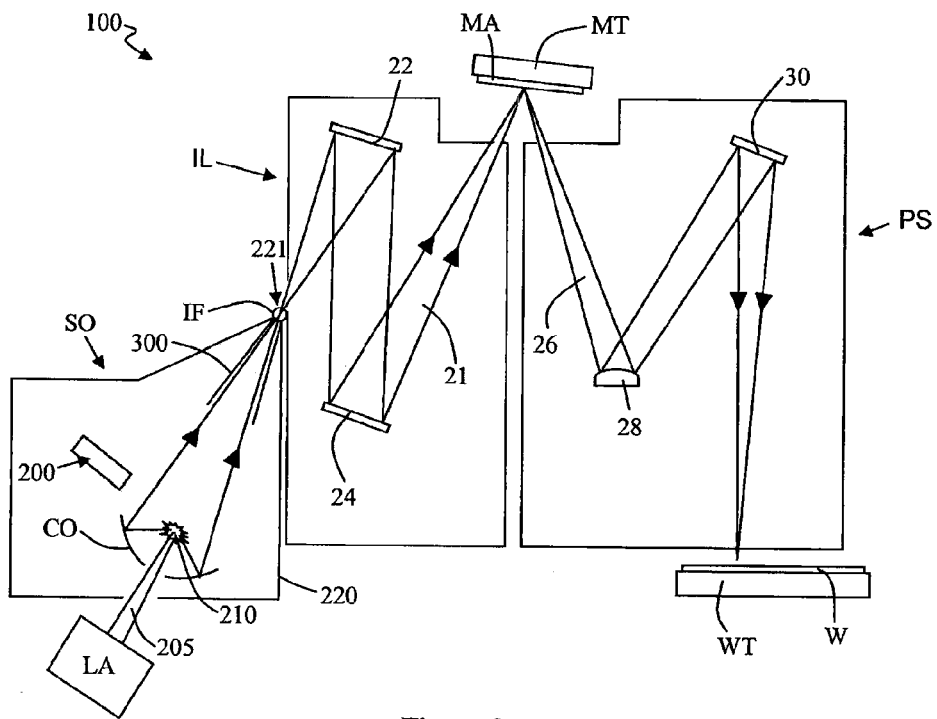
FIG. 2 schematically depicts the lithographic apparatus of FIG. 1 in more detail.

FIG. 2 shows the apparatus 100 in more detail, including the source SO, the illumination system IL, and the projection system PS. The source SO is constructed and arranged such that a vacuum environment can be maintained in an enclosing structure 220 of the source SO.

A laser LA is arranged to deposit laser energy via a laser beam 205 into a fuel droplet, such as xenon (Xe), tin (Sn) or lithium (Li) which is delivered from a fuel supply 200 to a plasma formation location 210. The laser beam 205 vaporises the fuel droplet and thereby generates a plasma at the plasma formation location 210. The plasma may have electron temperatures of several 10's of eV. The energetic radiation generated during de-excitation and recombination of these ions is emitted from the plasma, collected and focussed by a collector CO (for example a near normal incidence collector).

Radiation that is reflected by the collector CO is focused in a virtual source point IF. The virtual source point IF is commonly referred to as the intermediate focus, and the source SO may be arranged such that the intermediate focus IF is located at or near an opening 221 in the enclosing structure 220. The virtual source point IF is an image of the radiation emitting plasma.

Subsequently the radiation traverses the illumination system IL. The illumination system IL may include a facetted field mirror device 22 and a facetted pupil mirror device 24 arranged to provide a desired angular distribution of the radiation beam 21 at the patterning device MA, as well as a desired uniformity of radiation intensity at the patterning device MA. Upon reflection of the beam of radiation 21 at the patterning device MA, a patterned beam 26 is formed and the patterned beam 26 is imaged by the projection system PS via reflective elements 28, 30 onto a substrate W held by the substrate table WT.

More elements than shown may generally be present in the illumination system IL and projection system PS. Further, there may be more mirrors present than those shown in the figures, for example there may be 1-6 additional reflective elements present in the projection system PS than shown in FIG. 2.

The source SO may include a radiation conduit 300 through which the beam of EUV radiation formed by the collector CO passes before it reaches the intermediate focus IF. The radiation conduit 300, which is configured to absorb infrared radiation, is described below.

The radiation conduit 300 may comprise a body which tapers inwardly from an entrance aperture distal to the intermediate focus IF to an exit aperture proximal to the intermediate focus. The radiation conduit 300 may be conical or substantially conical, or may have some other suitable shape. The radiation conduit 300 may be substantially circular in cross-section, or may have some other suitable cross-sectional shape. The tapering of the radiation conduit 300 may be such that EUV radiation which is focused by the collector CO towards the intermediate focus IF passes unimpeded through the radiation conduit. The tapering of the radiation conduit 300 may be such that other radiation, particularly radiation which is not focused towards the intermediate focus IF, is incident upon the body of the radiation conduit. This other radiation may for example be infrared radiation. The infrared radiation may be radiation which is emitted by the laser LA and which is not absorbed by the fuel droplet but is instead scattered or reflected from it. This radiation may be diffracted towards the radiation conduit 300 by the collector CO (as described further below). It may be desirable to prevent or reduce the passage of diffracted infrared radiation from the source SO into the illuminator IL, since infrared radiation may cause damage to mirror devices 22, 24 (or to other components in the illuminator).

Figure 3:
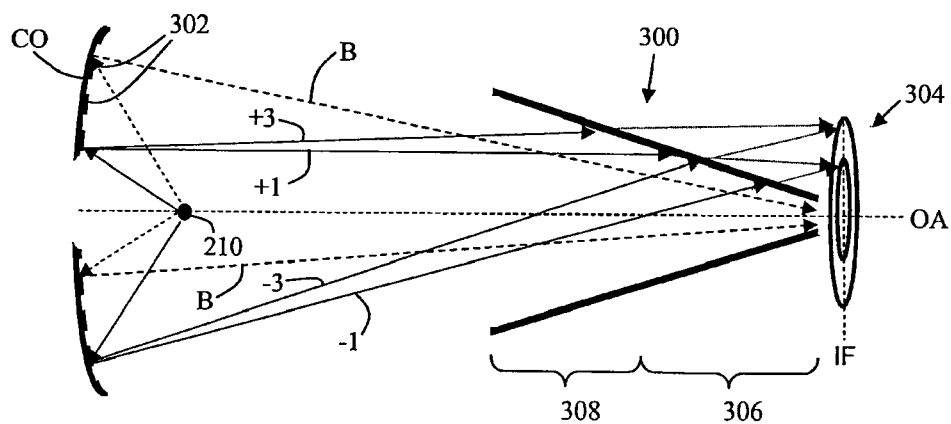
FIG. 3 schematically depicts part of a radiation source which may form part of the lithographic apparatus.

Part of the source SO is shown schematically in more detail in FIG. 3. FIG. 3 shows the plasma formation location 210, the intermediate focus IF, the collector CO and the radiation conduit 300. The radiation conduit 300 is located in between the collector CO and the intermediate focus IF (e.g. just before and adjacent to the intermediate focus). An exit aperture of the radiation conduit 300 may be located in the plane of the intermediate focus IF, or may be located away from intermediate focus (as schematically illustrated in FIG. 3). The collector CO may for example be a near normal incidence collector. The collector CO may have a shape which comprises part of an ellipse, a first focus of the ellipse being the plasma formation location 210 and a second focus of the ellipse being the intermediate focus IF. The collector CO shown in FIG. 3 is merely a schematic illustration and is not intended to depict an elliptical shape having this property.

EUV radiation emitted by a plasma at the plasma formation location 210 is represented schematically by two rays B. These rays travel to the collector CO which reflects the rays towards the intermediate focus IF. Thus, the collector CO focuses EUV radiation and directs it through the intermediate focus IF into the illumination system IL.

The surface of the collector CO is provided with a diffraction grating 302. The diffraction grating 302 is an amplitude binary grating which is configured to diffract infrared radiation. For example, the diffraction grating 302 may be configured to diffract infrared radiation having a wavelength of around 10.6 μm (this may be a wavelength of the laser beam 205 (see FIG. 2)). The diffraction grating 302 may for example have a period which is of the order of 1 mm, and may therefore provide strong diffraction of infrared radiation with a wavelength of around 10 μm. Because the period of the diffraction grating 302 is many orders of magnitude greater than the wavelength of the EUV radiation (which may for example be around 13.5 nm), the diffraction grating does not diffract the EUV radiation.

The diffraction grating 302 causes the infrared radiation to be diffracted. First and third diffraction orders of the infrared radiation are shown schematically as rays in FIG. 3, the rays being labelled as +1 and −1 (first order diffraction) and +3 and −3 (third order diffraction). The amplitude binary nature of the diffraction grating 302 is such that it only generates diffraction in odd orders and does not generate diffraction in even orders. Although the rays +1, −1, +3, −3 are incident upon the radiation conduit 300 and thus do not reach the plane of the intermediate focus IF, the rays are continued with dotted lines so that their positions in the plane of the intermediate focus may be illustrated. As is schematically shown, the infrared radiation forms a ring pattern 304 at the intermediate focus IF.

The radiation conduit 300 comprises an inner portion 306 and an outer portion 308, the inner portion being located closer to the intermediate focus IF than the outer portion. The inner portion 306 of the radiation conduit 300 is configured to reflect incident diffracted infrared radiation towards the outer portion 308 of the radiation conduit. The outer portion 308 of the radiation conduit 300 is configured to absorb infrared radiation. Thus, for example, a substantial proportion of the −1 diffraction order infrared radiation which is incident upon the inner portion 306 of the radiation conduit 300 is reflected to the outer portion 308 of the radiation conduit. This infrared radiation then undergoes multiple reflections at the outer portion 308 of the radiation conduit 300 such that a substantial proportion of the infrared radiation is absorbed at the outer portion of the radiation conduit. Similarly, a substantial proportion of the −3 diffraction order and +1 diffraction order infrared radiation is reflected from the inner portion 306 of the radiation conduit 300 to the outer portion 308 of the radiation conduit. Again, this infrared radiation then undergoes multiple reflections at the outer portion 308 of the radiation conduit 300 such that a substantial proportion of the infrared radiation is absorbed at the outer portion of the radiation conduit. In this embodiment the +3 diffraction order infrared radiation is not incident upon the inner portion 306 of the radiation conduit 300, but instead is incident upon the outer portion 308 of the radiation conduit (in this embodiment). The +3 diffraction order infrared radiation undergoes multiple reflections at the outer portion 308 of the radiation conduit 300 such that a substantial proportion of the infrared radiation is absorbed at the outer portion of the radiation conduit.

Although only the first and third diffraction orders are shown in FIG. 3, other diffraction orders may be generated by the diffraction grating 302 provided on the collector CO. These other diffraction orders may also be incident upon the radiation conduit. In an embodiment, around 80% of the diffracted infrared radiation may be in the first diffraction order, around 9% of the diffracted infrared radiation may be in the second diffraction order, and around 6% of the diffracted infrared radiation may be in the third diffraction order. The radii of the diffraction rings that would be seen at the plane of the intermediate focus IF if the radiation conduit 300 were not present may be calculated using simple trigonometry, based upon the wavelength of the infrared radiation, the period of the diffraction grating and the distance along the optical axis OA from the collector CO to the intermediate focus plane.

FIGS. 4a and 4b schematically compares a prior art radiation conduit with a radiation conduit according to an embodiment of the invention. FIG. 4a schematically shows the prior art radiation conduit 400 together with a collector CO. The collector CO is provided with a diffraction grating 302 which is configured such that infrared radiation emitted from the plasma formation location 210 is diffracted by the collector. The diffracted infrared radiation is not directed by the collector CO to the intermediate focus IF, but instead is incident upon the radiation conduit 400. The infrared radiation undergoes multiple reflections from walls of the radiation conduit 400 which cause the infrared radiation to travel along the radiation conduit. The infrared radiation thus passes along the radiation conduit 400 and out of an exit aperture of the radiation conduit. The infrared radiation may thus pass into an illuminator of the lithographic apparatus. This is undesirable for the reasons explained further above.

The radiation conduit 300 of the embodiment of the invention is shown schematically in FIG. 4b together with a collector CO. In common with the collector shown in FIGS. 3 and 4a, the collector CO is provided with a diffraction grating 302 which is configured such that infrared radiation emitted from the plasma formation location 210 is diffracted by the collector. The diffracted infrared radiation is incident upon the inner portion 306 of the radiation conduit 300. As is represented schematically in FIG. 4b, the infrared radiation is reflected from the inner portion 306 of the radiation conduit 300, and passes to the outer portion 308 of the radiation conduit. The infrared radiation undergoes multiple reflections within the outer portion 308 of the radiation conduit 300. A substantial proportion of the infrared radiation is absorbed by the outer portion 308 of the radiation conduit 300 as a result of these multiple reflections. The number of reflections of a given ray of infrared radiation in the outer portion 308 of the radiation conduit 300 may be more than 10, may be more than 20, and may be more than 30.

As may be seen by comparing the radiation conduit 300 of the embodiment of the invention with the prior art radiation conduit 400, the embodiment of the invention may reduce the amount of infrared radiation which passes out of an exit aperture of the radiation conduit. Consequently, the amount infrared radiation which passes into the illuminator IL of the lithographic apparatus 100 may be reduced. Furthermore, a substantial amount of infrared radiation is absorbed by the outer portion 308 of the radiation conduit 300. This spreads out the heat transferred from the infrared radiation to the radiation conduit. In contrast to this, in the prior art radiation conduit 400, the infrared radiation may undergo more reflections as it gets closer to the exit aperture of the radiation conduit. This will tend to concentrate heat transferred from the infrared radiation to a portion of the radiation conduit 400 which is close to the intermediate focus IF. As a result, this portion of the radiation conduit 400 may be heated to a very high temperature, which may cause damage to the radiation conduit 400.

A second radiation conduit 301 may be connected to the radiation conduit 300, the second radiation conduit tapering outwards from the intermediate focus IF and extending into the illuminator of the lithographic apparatus. In this embodiment, the second radiation conduit 301 has an entrance aperture which lies in the plane of the intermediate focus IF and tapers outwardly to an exit aperture which lies in the illuminator. The second radiation conduit 301 is not essential.

Figure 4:
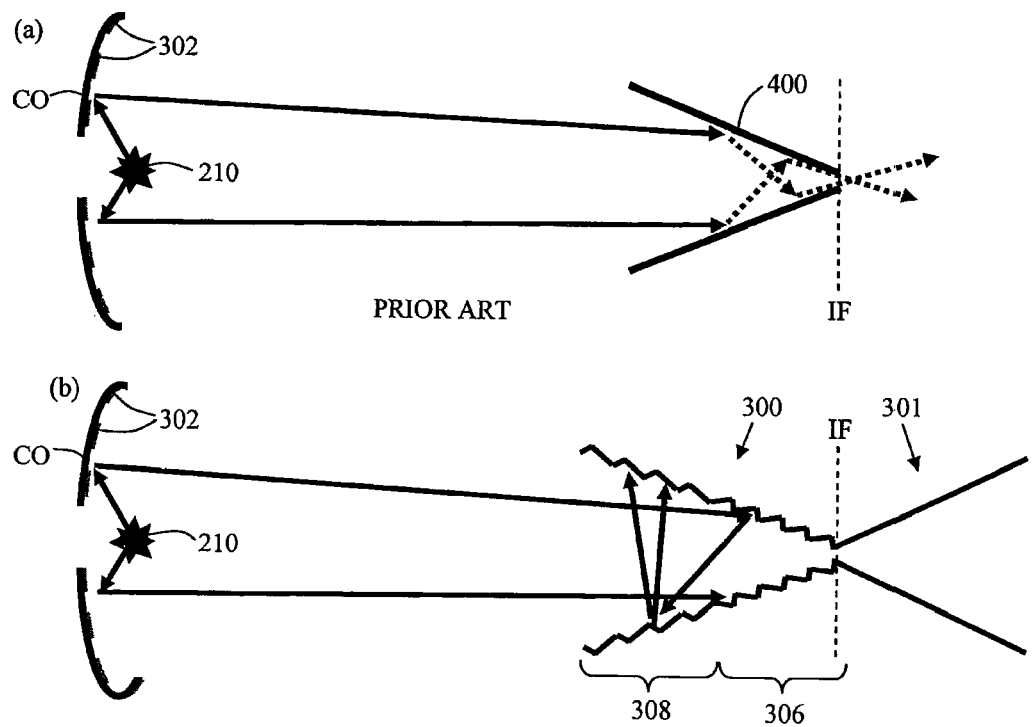
FIG. 4a schematically depicts a prior art radiation source.
FIG. 4b schematically depicts a radiation source of the lithographic apparatus according to an embodiment of the invention.

As may be seen by comparing FIG. 3 and FIG. 4b, the exit aperture of the radiation conduit 300 may be adjacent to the intermediate focus plane IF (as shown in FIG. 3), or may lie in the intermediate focus plane (as shown in FIG. 4). In both cases, the radiation conduit 300 is located before the intermediate focus plane IF.

The inner portion 306 of the radiation conduit 300 may be formed from a material which has a lower absorption coefficient for infrared radiation than the outer portion 308 of the radiation conduit. For example, the inner portion 306 of the radiation conduit 300 may be formed from copper, which may have an absorption coefficient for infrared radiation of around 3%. For example, the outer portion 308 of the radiation conduit 300 may be formed from stainless steel, which may have an absorption coefficient for infrared radiation of around 15%. Although a primary purpose of the inner portion 306 of the radiation conduit 300 is to reflect infrared radiation towards the outer portion 308 of the radiation conduit, it will absorb some infrared radiation because it has a non-zero absorption coefficient. Although a primary purpose of the outer portion 308 of the radiation conduit 300 is to absorb infrared radiation, since it has absorption coefficient of around 15% a multiplicity of reflections of the infrared radiation may occur in the outer portion of the radiation conduit. Energy will be transferred from the infrared radiation to the outer portion 308 of the radiation conduit 300 during each of these reflections. As a result, a substantial proportion of the energy of the infrared radiation may be transferred to the outer portion 308 of the radiation conduit 300. Some infrared radiation may pass out of the radiation conduit 300 and back into the source SO. This infrared radiation may be absorbed by the enclosing structure 220 (see FIG. 2) of the source SO.

In an embodiment, around 30% of the infrared radiation which enters the radiation conduit 300 may be absorbed by the inner portion 306 of the radiation conduit, and around 30% may be absorbed by the outer portion 308 of the radiation conduit. Around 33% of the infrared radiation which enters the radiation conduit 300 may pass back out of the radiation conduit into the source SO and may be absorbed by the enclosing structure 220. Around 7% of the infrared radiation which enters the radiation conduit 300 may pass through the intermediate focus IF and into the illuminator IL.

The amount of infrared radiation which is absorbed by the inner portion 306 of the radiation conduit may seem high, given that the inner portion of the radiation conduit has a relatively low absorption coefficient for infrared radiation (e.g. 3%). This relatively high amount arises from the fact that a majority of the diffracted infrared radiation lies in the first diffraction order, and this first diffraction order is initially incident upon the inner portion of the radiation conduit 306.

FIG. 5 shows schematically in more detail a radiation conduit 300 according to an embodiment of the invention. As may be seen in FIG. 5, the inner portion 306 of the radiation conduit 300 comprises a first periodic structure 310. Since the first periodic structure is configured to reflect infrared radiation towards the outer portion 308 of the radiation conduit, the first periodic structure is hereafter referred to as the reflective structure 310. Although only four periods of the reflective structure 310 are shown in FIG. 5 this is merely a schematic illustration, and in practice more than four periods of the reflective structure may be provided. For example, ten or more periods of the reflective structure 310 may be provided. It is not essential that the reflective structure 310 is periodic.

The outer portion 308 of the radiation conduit 300 comprises a second structure 312. Since the second structure is configured to absorb infrared radiation, the second structure is hereafter referred to as the absorptive structure 312. Although only seven ridges of the absorptive structure 312 are shown in FIG. 5 this is merely a schematic illustration, and in practice more than seven ridges of the absorptive structure may be provided. For example, ten or more ridges, or twenty or more ridges of the absorptive structure 312 may be provided. The ridges may have equal thicknesses and equal separations such that they are periodic. Alternatively, the ridges may have different thicknesses and/or different separations.

The absorptive structure 312 is configured such that a ray of infrared radiation that has been reflected from reflective structure 310 will typically undergo a plurality of reflections within the absorptive structure 312 before it leaves the radiation conduit 300. The absorptive structure 312 may take the form of a plurality of ridges 314. The ridges 314 may be angled away from the intermediate focus IF. The ridges may define spaces 316 between the ridges. Infrared radiation may enter a space 316 and may undergo multiple reflections in the space. The ridges may for example subtend an angle of around 60° relative to the optical axis OA. An example of an absorptive structure which may be used is described in U.S. Provisional Application Ser. No. 61/435,846, filed Jan. 25, 2011, which is herein incorporated by reference.

As mentioned above, the reflective structure 310 is configured such that infrared radiation which is incident upon it will be reflected towards the absorptive structure 312. The reflective structure 310 comprises a series of faces 318 which are oriented such that they reflect incident infrared radiation towards the absorptive structure 312. The faces 318 are connected by connecting portions 320.

The reflective structure 310 does not provide perfect (i.e. 100%) reflection of incident infrared radiation. Similarly, the absorptive structure 312 does not provide perfect (i.e. 100%) absorption of incident infrared radiation. The reflective structure 310 may reflect more than 50% of diffracted infrared radiation which is incident upon it. The absorptive structure 312 may absorb more than 50% of infrared radiation which is reflected onto it by the reflective structure 310.

Although the reflective structure 310 is referred to above as being periodic, it is not essential that the reflective structure is periodic. Different separations may be provided between different faces 318 of the reflective structure.

Although the faces 318 are two-dimensional in FIG. 5, it will be appreciated that FIG. 5 is merely a schematic representation of a three-dimensional object. The faces 318 extend around the interior of the radiation conduit in a direction which is substantially transverse to the optical axis OA. The faces 318 may have generally annular shapes.

FIG. 6 shows a single face 318 and a single connecting portion 320 of the reflective structure 310. Also shown in FIG. 6 is a dotted line 322 which represents the angle of taper of the radiation conduit 300. Referring to FIG. 5, the dotted line 322 touches innermost ends of the structures of the radiation conduit 300. The angle of taper of the radiation conduit 300 is selected to allow EUV radiation which is collected and focused by the collector CO within a desired solid angle to pass unimpeded through the radiation conduit to the intermediate focus IF. In an embodiment the angle of taper a of the radiation conduit 300 may be around 14° relative to the optical axis OA of the source.

As described further above in relation to FIG. 3, infrared radiation which is diffracted by the collector CO will be incident upon the radiation conduit 300. As will be appreciated from FIG. 3, the position along the radiation conduit 300 at which a given infrared radiation diffraction order is incident upon the radiation conduit will vary. For example, the −1 diffraction order is incident upon the radiation conduit 300 closest to the intermediate focus IF. The −3 diffraction order is incident upon the radiation conduit 300 further away from the intermediate focus IF, and the +1 and +3 diffraction orders are incident successively further away from intermediate focus. In an embodiment in which the wavelength of the infrared radiation is known (for example 10.6 μm), the size of the diffraction ring pattern at the intermediate focus IF may be calculated for any given collector CO and collector diffraction grating 302. Therefore, for a given orientation and position of the radiation conduit 300, the locations at which infrared radiation diffraction orders are incident upon the radiation conduit may be calculated. Similarly, the orientations of infrared radiation diffraction orders when they are incident upon the radiation conduit 300 may also be calculated. This allows a calculation to be performed which determines the orientations of faces 318 of the radiation conduit 300, which will direct incident infrared radiation towards the absorptive structure 312 (or direct a substantial proportion of incident infrared radiation towards the absorptive structure). Although there may not be an analytical equation available which allows this calculation to be performed, the calculation may be performed using modelling software in a conventional manner.

The performance of the faces 318 depends in part upon their orientation. Referring to FIG. 6, the angle θ subtended by the face 318 relative to the orientation of the radiation conduit is indicated. If the angle θ were to be small, for example around 20°, then the face 318 would not reflect a significant amount of incident infrared radiation towards the outer portion 308 of the radiation conduit 300. The infrared radiation would instead remain in the inner portion 306 of the radiation conduit. This may cause an undesirable amount of heating of the inner portion 306 of the radiation conduit, since a large proportion of infrared radiation would remain in the inner portion. Conversely, if the angle θ were to be too large, for example around 75°, then the face 318 would not reflect incident infrared radiation towards the outer portion 308 of the radiation conduit 300, but would instead reflect incident infrared radiation out of the radiation conduit. In general, if the angle θ were to have an intermediate value, then some infrared radiation would remain within the inner portion 306 of the radiation conduit 300, some infrared radiation would be reflected to the outer portion 308, and some radiation would be reflected out of the radiation conduit. The extent to which the radiation is divided between these three possibilities will depend upon the angle θ.

Figure 7:
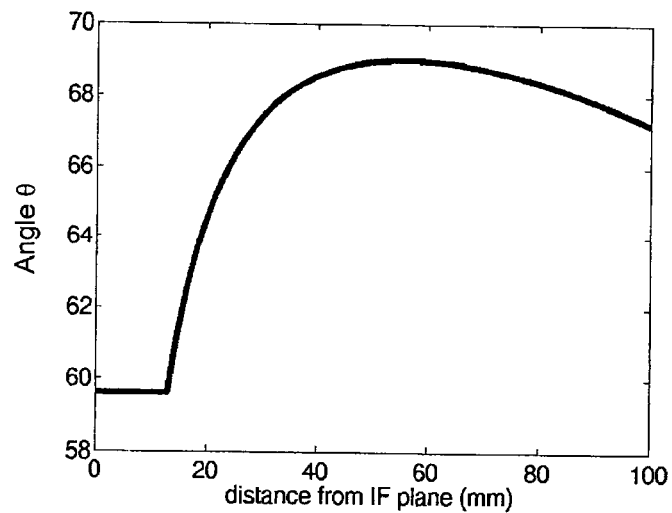
FIG. 7 is a graph which depicts angles of faces of part of the radiation conduit.

In an embodiment, the angle θ may vary as a function of distance from the plane of the intermediate focus IF. An example of an angular variation which may be used is shown in FIG. 7. As may be seen from FIG. 7, the angle θ is constant at around 59.5° close to the plane of the intermediate focus IF. As the distance from the plane of the intermediate focus IF increases, the angle θ increases at a decreasing rate, rising to a maximum angle of around 69°. This maximum angle occurs at around 55 mm from the plane of the intermediate focus IF. As the distance from the plane of the intermediate focus IF increases further, the angle θ decreases and drops to around 67° at a distance of 100 mm from the plane of the intermediate focus (this is the end of the inner portion 306 of the radiation conduit in this embodiment).

The angles θ shown in FIG. 7, or similar angles, may for example be used for a radiation conduit 300 which subtends an angle α of around 14° relative to the optical axis OA of the source. The radiation conduit 300 may for example have an inner portion which is between 80 and 100 mm long, and may for example have an outer portion which is between 300 and 400 mm long. The entrance aperture of the radiation conduit 300 may have a diameter of around 400 mm, and the exit of the radiation conduit may have a diameter of around 6 mm. If the angles θ shown in FIG. 7 are used for a radiation conduit 300 having these properties, then the faces 318 of the reflective structure 310 may direct infrared radiation towards a part of the outer portion 308 of the radiation conduit which is at or before the entrance aperture of the radiation conduit.

In practice, due to manufacturing tolerances, surface roughness and the deposition of Sn during operation of the lithographic apparatus, the faces 318 will not provide perfect reflections of incident infrared radiation. The incident infrared radiation may therefore be reflected from the faces over a range of angles. Thus, the paths traveled by infrared radiation may deviate from the paths which would be traveled if the faces 318 were to be perfectly manufactured. For this reason, the benefit obtained from varying the angle θ as a function of distance from the plane of the intermediate focus IF may be limited.

In an embodiment, the angle θ may be constant (i.e. does not vary as a function of distance from the plane of the intermediate focus IF). The angle θ may for example be less than 70°, less than 65°, or equal to or less than 60°. An angle of less than 65° (or equal to or less than 60°) may be beneficial in that it may provide a reduced probability that incident infrared radiation is directly reflected out of the radiation conduit 300. The angle θ may for example be greater than 50°, or greater than 55°. These angular ranges may apply when the radiation conduit 300 subtends an angle α of around 14° relative to the optical axis OA. If the radiation conduit 300 subtends a modified angle α relative the optical axis OA, then this may apply a corresponding modification to the angle θ. A benefit of keeping the angle θ constant as a function of distance from the plane of the intermediate focus IF is that the radiation conduit 300 may be easier to manufacture (it may be difficult to manufacture a reflective structure 310 in which the angle θ varies).

The orientation of the faces 318 of the reflective structure 310 may for example be selected such that, for a given source geometry, a majority of the +1 diffraction order and −1 diffraction order infrared radiation is reflected by the reflective structure 310 to the outer portion 308 of the radiation conduit. The orientation of the faces 318 of the reflective structure 310 may be selected based upon an average angle of incidence of the infrared radiation.

Referring again to FIG. 6, the angle θ subtended by the face 318 relative to the angle of taper 322 of the radiation conduit may be 60°. The connecting portion 320 may be perpendicular to the face 318. Where this is the case, the connecting portion 320 may subtend an angle φ of 30° relative to the angle of taper 322 of the radiation conduit. It is not essential that the connecting portion 320 is perpendicular to the face 318 (although this may allow a more straightforward calculation of a desired angle of the face to be performed). The connecting portion 320 may subtend some other angle relative to the face 318.

The face 318 may for example have a length of around 2 mm, or may have any other suitable length. The connecting portion 320 may for example have a length of around 3.5 mm, or may have any other suitable length.

The outer portion 308 of the radiation conduit 300 may for example be at least twice as long as the inner portion 306 of the radiation conduit. The outer portion 308 of the radiation conduit 300 may for example be at least four times as long as the inner portion of the radiation conduit.

Figure 8:
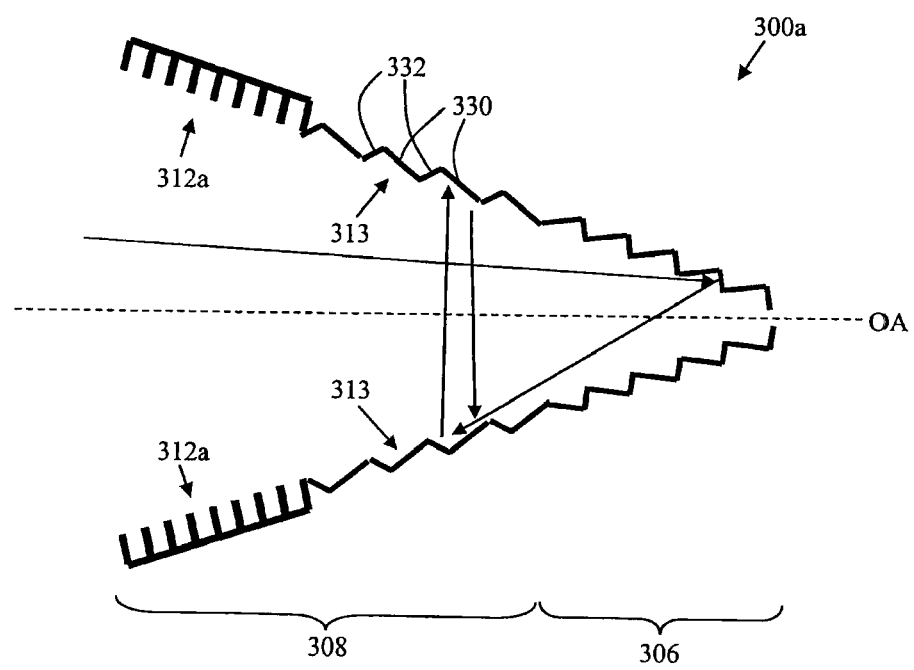
FIG. 8 schematically depicts a radiation conduit of the radiation source according to an embodiment of the invention.

An alternative embodiment of the invention is shown schematically in FIG. 8. The alternative embodiment of the invention corresponds with that shown in FIG. 5, except that the outer portion 308 of the radiation conduit 300a comprises two different absorptive structures 312a, 313 rather than a single absorptive structure. A first absorptive structure 312a is provided at an outer part of the outer portion 308 of the radiation conduit 300a. This first absorptive structure 312a may correspond with the absorptive structure 312 described above in connection with FIG. 5. The first absorptive structure 312a may comprise a plurality of ridges which are angled away from the intermediate focus IF, the ridges defining spaces into which infrared radiation may enter. The ridges may for example subtend an angle of around 60° relative to the optical axis OA.

The second absorptive structure 313 may comprise a plurality of faces which are oriented such that they receive infrared radiation that has been reflected from the inner portion 306, and reflect the infrared radiation across the radiation conduit. For example, faces of the second absorptive structure 313 may be oriented such that they receive infrared radiation has been reflected from the inner portion 306 and reflect this light in a direction which is substantially perpendicular to the optical axis OA. The second absorptive structure 313 may be configured to cause multiple crossings of reflected infrared radiation across the radiation conduit (e.g. 10 or more crossings, 20 or more crossings, or 30 or more crossings). After each of these crossings, the infrared radiation may be incident at a different location on the second absorptive structure 313. As a consequence, heat may be transferred from the infrared radiation to a variety of different locations on the second absorptive structure 313, thereby spreading out heat across the second absorptive structure. This may provide the benefit that a heat load is not focused at particular locations in an absorptive structure (thereby reducing material stress that may be caused by localised heat loads).

The second absorptive structure 313 may have a saw-tooth form, and may comprise a plurality of reflective faces 330 oriented at a first angle which alternates with a plurality of reflective faces 332 oriented at a second angle. The reflective faces 330 oriented at the first angle are longer than the reflective faces 332 oriented at the second angle and are referred to hereafter as the long faces 330. The reflective faces 332 oriented at the second angle are referred to hereafter as the short faces 332.

Figure 9:
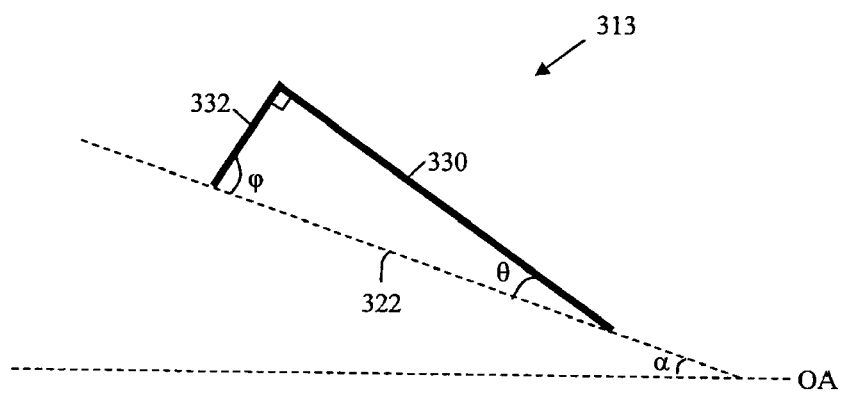
FIG. 9 schematically depicts part of the radiation conduit of FIG. 8.

A long face 330 and a short face 332 are shown in FIG. 9. The short face 332 is oriented such that radiation which is reflected from the inner portion 306 of the radiation conduit 300a (see FIG. 8) is incident upon the short face, and such that that radiation is reflected by the short face across the radiation conduit. The long face 330 is substantially perpendicular to the short face 332, and as a result the combination of the long face and the short face acts as a retro-reflector for radiation which has traveled across the radiation conduit before being incident upon the long face or the short face (e.g. radiation which is substantially perpendicular to the optical axis OA). Thus, the long face 330 and the short face 332 are configured to direct the infrared radiation such that it makes multiple passes across the radiation conduit. Energy is transferred from the infrared radiation to the radiation conduit each time it is reflected from the faces 330, 332, and the multiple passes of the infrared radiation across the radiation conduit thus allow the radiation conduit to absorb energy from the infrared radiation.

In an embodiment, the long face 330 may subtend an angle θ of around 17° relative to the taper 322 of the radiation conduit. The short face 332 may subtend an angle φ of around 73° relative to the taper 322 of the radiation conduit. The short face 332 may subtend angle of 90° relative to the long face 330. This embodiment may be utilized for example when faces 318 of the inner portion 306 of the radiation conduit 300 (see FIG. 5) are oriented at 61° relative to the taper 322 of the radiation conduit.

The second absorptive structure 313 may have faces 330, 332 which have orientations designed to promote multiple crossings of infrared radiation across the radiation conduit. The orientation of the short faces 332 may be determined using geometry, taking into account the orientation of infrared radiation which is reflected from the inner portion 306 of the radiation conduit 300 towards the second absorptive structure 313. The long faces 330 may be provided at right angles relative to the short faces 332, to allow the combination of a long face and a short face to act as a retro-reflector for incident radiation which has traveled across the radiation conduit.

The long faces 330 may for example be a few millimeters long.

The short faces 332 may for example subtend an angle φ of less than 80° relative to the taper 322 of the radiation conduit. The short faces 332 may for example subtend angle cp of more than 65° relative to the taper 322 of the radiation conduit. As explained above, the angle φ may be selected such that the short faces 332 direct radiation received from the inner portion 306 across the radiation conduit.

The orientations of faces 318 of the inner portion 306 and of short faces 332 of the outer portion 308 may be entirely determined by the angle of incidence of the incident infrared radiation on the radiation conduit 300 (taking into account the angle of taper of the radiation conduit), using the geometrical considerations described above.

Although only four periods of the second absorptive structure 313 are shown in FIG. 8, the second absorptive structure may have any suitable number of periods. For example, the second absorptive structure may have ten or more periods, and may have twenty or more periods.

When a radiation conduit 300a of the type shown in FIG. 8 is used, the orientations of faces of the inner portion 306 of the radiation conduit may be oriented such that they reflect diffracted infrared radiation towards the second absorptive structure 313 rather than towards the first absorptive structure 312a. The first absorptive structure 312a may receive infrared radiation after it has been reflected from the second absorptive structure 313. The intensity of the infrared radiation when it reaches the first absorptive structure 312a will be less than would have been the case if it had been reflected from the inner portion 306 directly to the first absorptive structure. This may be beneficial because it may reduce the heat load applied to the first absorptive structure 312a, and may thereby avoid thermal problems arising at the first absorptive structure (the form of the first absorptive structure may cause heat to be concentrated at particular locations within the structure because it tends to capture radiation such that it undergoes several reflections in a localised area).

In an embodiment, the first absorptive structure 312a may be omitted from the radiation conduit. Where this is the case, the radiation conduit may comprise an inner portion 306 having a reflective structure, and an outer portion having the second absorptive structure 313.

As mentioned further above, a benefit provided by embodiments of the invention is that they reduce the amount of heat that is transferred by infrared radiation to the radiation conduit close to the plane of the intermediate focus IF. A consequential benefit that may arise from the reduced heat transfer at this location is that a cooling apparatus with a lower capacity may be used to cool the radiation conduit 300, 300a.

A further consequential benefit may be that less heat is transferred to the location at which a dynamic gas lock may be provided. The dynamic gas lock may comprise one or more sources of gas which are configured to direct gas into the source SO (see FIG. 2), the flow of gas being configured to inhibit contamination from passing from the source to the illuminator IL. Reducing the temperature of the dynamic gas lock may increase its effectiveness, and may therefore reduce the pump capacity needed in order to obtain a desired level of contamination suppression using the gas flow.

In addition to absorbing infrared radiation which is reflected from the inner portion 306 of the radiation conduit 300, 300a to the outer portion 308, the absorbing structure 312, 312a, 313 may also absorb infrared radiation which has passed directly from the collector to the radiation conduit. In addition, the absorbing structure 312, 312a, 313 may also absorb EUV radiation which has not been focused by the collector towards the intermediate focus IF.

The radiation conduit 300 may act as a heat sink for infrared radiation in the source.

The radiation conduit may be cooled by an active cooling system. The active cooling system may for example comprise a water-based cooling system.

The orientations of the faces 318 of the reflective structure 310 may for example be selected such that, for a given source geometry, a majority of the +1 diffraction order and −1 diffraction order infrared radiation is reflected by the reflective structure 310 to the outer portion 308 of the radiation conduit.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

In an embodiment, the laser LA may be provided separately from the source SO. The laser LA may be connected to the source SO such that the source receives a laser beam emitted by the laser.

The term "lens", where the context allows, may refer to any one or combination of various types of optical components, including refractive, reflective, magnetic, electromagnetic and electrostatic optical components.

The term "EUV radiation" may be considered to encompass electromagnetic radiation having a wavelength within the range of 5-20 nm, for example within the range of 13-14 nm, or example within the range of 5-10 nm such as 6.7 nm or 6.8 nm.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein. The descriptions above are intended to be illustrative, not limiting. Thus it will be apparent to one skilled in the art that modifications may be made to the invention as described without departing from the scope of the claims set out below.

What is claimed is:

1. A radiation source comprising:
   a fuel supply configured to deliver fuel to a plasma emission location for vaporization by a laser beam to form a plasma;
   a collector configured to collect EUV radiation emitted by the plasma and direct the EUV radiation towards an intermediate focus, the collector comprising a diffraction grating configured to diffract infrared radiation emitted by the plasma; and
   a radiation conduit located in between the collector and the intermediate focus, the radiation conduit comprising an entrance aperture connected by an inwardly tapering body to an exit aperture, the radiation conduit comprising an inner portion and an outer portion, the inner portion being closer to the intermediate focus than the outer portion, wherein the inner portion is configured to reflect incident diffracted infrared radiation towards the outer portion.

2. The radiation source of claim 1, wherein the inner portion comprises a reflective structure and the outer portion comprises an absorptive structure.

3. The radiation source of claim 1, wherein the inner portion comprises a plurality of faces oriented to reflect incident diffracted infrared radiation towards the outer portion.

4. The radiation source of claim 3, wherein the plurality of faces are oriented to reflect first order incident diffracted infrared radiation towards the outer portion.

5. The radiation source of claim 3, wherein at least some of the plurality of faces subtend an angle of less than 70° relative to an angle of taper of the radiation conduit.

6. The radiation source of claim 4, wherein at least some of the plurality of faces subtend an angle of 61° or less relative to an angle of taper of the radiation conduit.

7. The radiation source of claim 3, wherein the plurality of faces extend around the interior of the radiation conduit in a direction substantially transverse to an optical axis of the radiation source.

8. The radiation source of claim 1, wherein the outer portion comprises a plurality of ridges angled away from the intermediate focus.

9. The radiation source of claim 1, wherein the outer portion comprises a first absorptive structure and a second absorptive structure.

10. The radiation source of claim 9, wherein the second absorptive structure comprises a plurality of faces configured to receive infrared radiation reflected from the inner portion of the radiation conduit, and to reflect that infrared radiation across the radiation conduit.

11. The radiation source of claim 9, wherein the second absorptive structure has a saw-tooth form.

12. The radiation source of claim 11, wherein the second absorptive structure includes faces substantially perpendicular to one another and oriented to retro-reflect infrared radiation that has traveled across the radiation conduit.

13. The radiation source of claim 9, wherein the first absorptive structure comprises a plurality of ridges angled away from the intermediate focus.

* * * * *